(12) United States Patent
Liu

(10) Patent No.: US 9,673,126 B2
(45) Date of Patent: Jun. 6, 2017

(54) MULTI-FUNCTIONAL SEMICONDUCTOR REFRIGERATING AND WARMING DUAL-PURPOSE BOX AND MANUFACTURING METHOD

(71) Applicant: Chongqing Semiconductor Klc Holdings Ltd, Chongqing (CN)

(72) Inventor: Wanhui Liu, Chongqing (CN)

(73) Assignee: Chongqing Semiconductor Klc Holdings Ltd. (CN)

( * ) Notice: Subject to any disclaimer, the term of this patent is extended or adjusted under 35 U.S.C. 154(b) by 218 days.

(21) Appl. No.: 14/440,547

(22) PCT Filed: Nov. 4, 2013

(86) PCT No.: PCT/CN2013/086518
§ 371 (c)(1),
(2) Date: May 4, 2015

(87) PCT Pub. No.: WO2014/067492
PCT Pub. Date: May 8, 2014

(65) Prior Publication Data
US 2015/0303124 A1 Oct. 22, 2015

(30) Foreign Application Priority Data

Nov. 5, 2012 (CN) .......................... 2012 1 0513811

(51) Int. Cl.
*F28F 7/00* (2006.01)
*H01L 23/34* (2006.01)
(Continued)

(52) U.S. Cl.
CPC .............. *H01L 23/34* (2013.01); *B23P 15/26* (2013.01); *F25B 21/02* (2013.01); *F25D 11/00* (2013.01);
(Continued)

(58) Field of Classification Search
CPC .. H01L 23/34; H01L 2924/0002; F25B 21/02; F25B 2321/0252; B23P 15/26; F25D 11/00
(Continued)

(56) References Cited

U.S. PATENT DOCUMENTS

| 5,504,924 A * | 4/1996 | Ohashi ............... F28D 15/0233 361/676 |
| 2001/0020365 A1 * | 9/2001 | Kubo ................. F28D 15/0266 62/1 |

(Continued)

FOREIGN PATENT DOCUMENTS

| CN | 101893346 U | 11/2010 |
| CN | 202063404 U | 12/2011 |

(Continued)

OTHER PUBLICATIONS

International Search Report for Application No. PCT/CN2013/086518 dated Jan. 23, 2014.

*Primary Examiner* — Davis Hwu
(74) *Attorney, Agent, or Firm* — Lerner, David, Littenberg, Krumholz & Mentlik, LLP

(57) ABSTRACT

A multi-functional semiconductor refrigerating and warming dual-purpose box includes a box body, a refrigerating and heating unit, a composite condenser unit, and a liquid delivering pump. The box body includes two independent rooms, a bottom machine room, an upper working room, and a lower working room. The refrigerating and heating unit includes an upper room semiconductor refrigerating and heating unit and a lower room semiconductor refrigerating and heating unit, the upper room semiconductor refrigerating and heating unit comprising an external heat exchanger of the upper room, a first semiconductor chilling plate, and an internal heat exchanger of the upper room. The composite condenser unit and the liquid delivering pump are connected (Continued)

to the external heat exchanger of the upper room and the external heat exchanger of the lower room through pipes. A manufacturing method of a multi-functional semiconductor refrigerating and warming dual-purpose box is also provided.

18 Claims, 5 Drawing Sheets

(51) Int. Cl.
*F25B 21/02* (2006.01)
*F25D 11/00* (2006.01)
*B23P 15/26* (2006.01)

(52) U.S. Cl.
CPC .............. *F25B 2321/0252* (2013.01); *H01L 2924/0002* (2013.01)

(58) Field of Classification Search
USPC ........................................... 165/80.2
See application file for complete search history.

(56) References Cited

U.S. PATENT DOCUMENTS

| | | | |
|---|---|---|---|
| 2006/0185711 A1 | 8/2006 | Bang et al. | |
| 2008/0259566 A1* | 10/2008 | Fried | F28D 15/0266 361/699 |
| 2008/0266884 A1* | 10/2008 | Bogner | H01L 23/427 362/373 |
| 2012/0299175 A1* | 11/2012 | Tran | B82Y 10/00 257/712 |

FOREIGN PATENT DOCUMENTS

| | | |
|---|---|---|
| CN | 202244664 U | 5/2012 |
| CN | 202869114 U | 4/2013 |

* cited by examiner

MULTI-FUNCTIONAL SEMICONDUCTOR REFRIGERATING AND WARMING DUAL-PURPOSE BOX AND MANUFACTURING METHOD

CROSS-REFERENCE TO RELATED APPLICATION

This application is a national phase entry under 35 U.S.C. §371 of International Application No. PCT/CN2013/086518, filed Nov. 4, 2013, which claims priority to Chinese Patent Application No. 201210513811.2, filed Nov. 5, 2012, the disclosures of which are incorporated herein by reference.

BACKGROUND

1. Technical Field

The disclosure relates to a multi-functional semiconductor refrigerating and warming dual-purpose box, and particularly to a manufacturing method of the multi-functional semiconductor refrigerating and warming dual-purpose box.

2. Description of Related Art

The refrigerating efficiency of a prior semiconductor refrigerating and warming dual-purpose box is very far from enough, the volume of the prior semiconductor refrigerating and warming dual-purpose box is very small (100 L). Therefore, a multi-functional semiconductor refrigerating and warming dual-purpose box and manufacturing method which has high refrigerating efficiency is needed to be provided.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

Figure 1:
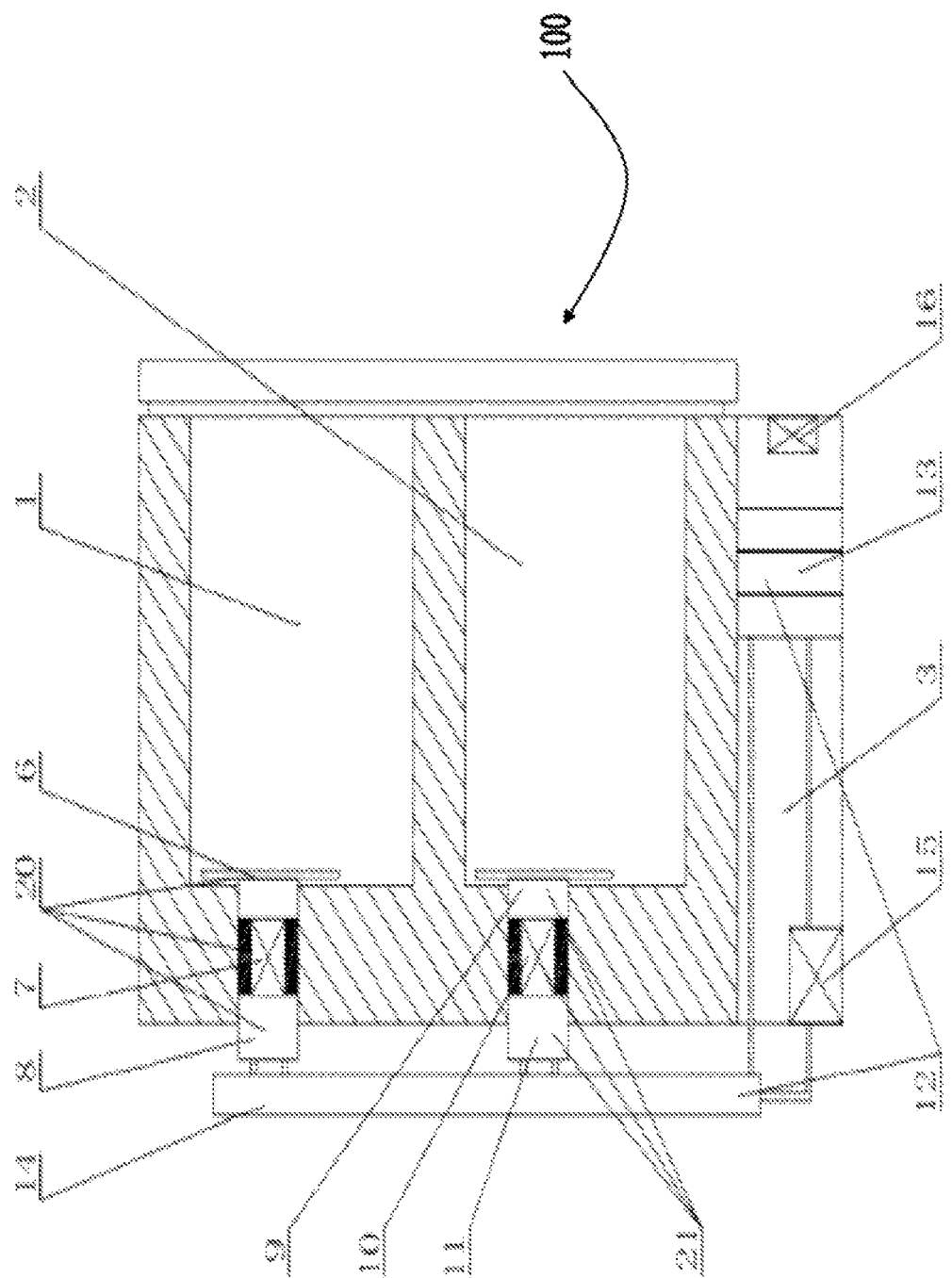
FIG. 1 is a section view of one embodiment of a multi-functional semiconductor refrigerating and warming dual-purpose box.
Figure 2:
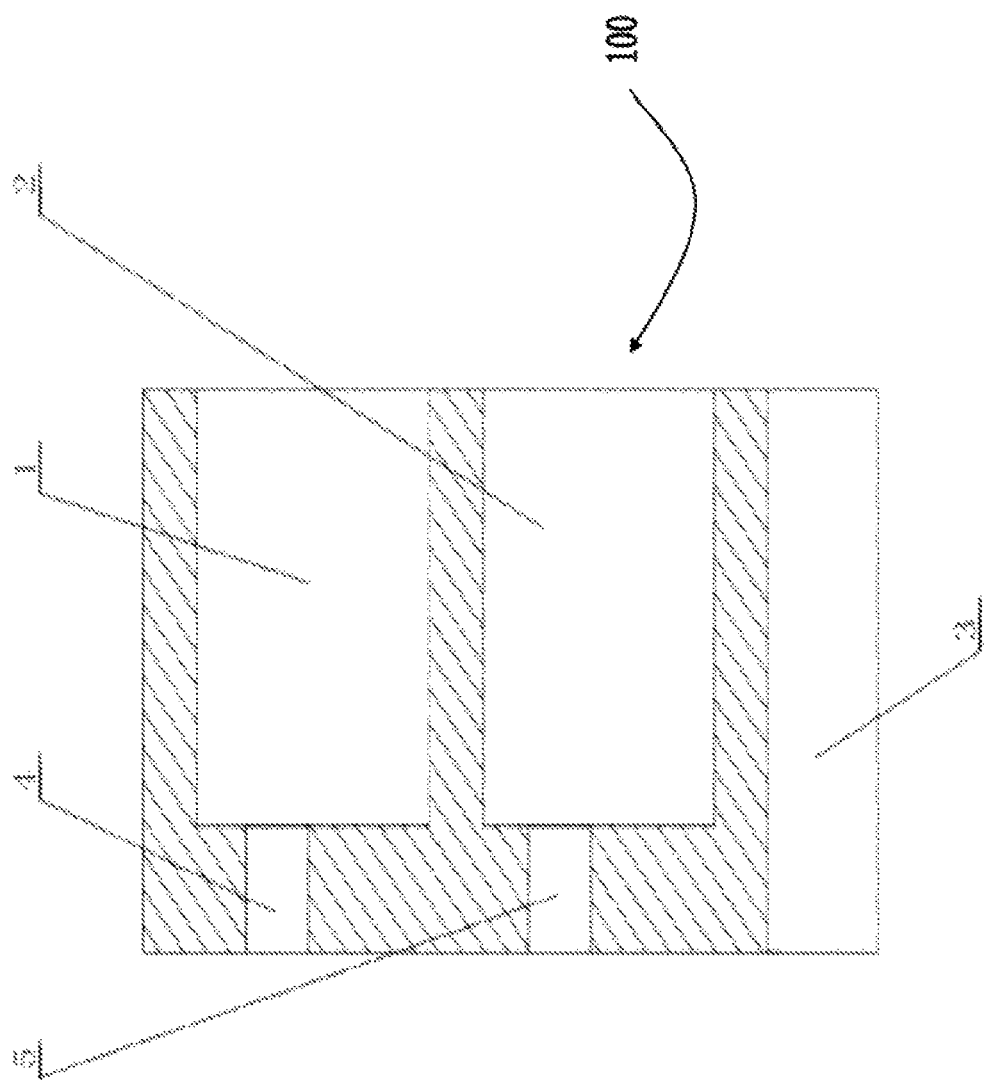
FIG. 2 is a section view of one embodiment of a box body of a multi-functional semiconductor refrigerating and warming dual-purpose box.

FIG. 1 is a section view of one embodiment of a multi-functional semiconductor refrigerating and warming dual-purpose box 100. FIG. 2 is a section view of one embodiment of a box body of the multi-functional semiconductor refrigerating and warming dual-purpose box 100. In one embodiment, the multi-functional semiconductor refrigerating and warming dual-purpose box 100 comprises an upper room (1), a lower room (2), a bottom machine room (3), an upper working room (4), a lower working room (5), an internal heat exchanger of the upper room (6), a first semiconductor chilling plate (7), an external heat exchanger of the upper room (8), an internal heat exchanger of the lower room (9), a second semiconductor chilling plate (10), an external heat exchanger of the lower room (11), a composite condenser unit (12), a first composite condenser (13), a second composite condenser (14), a liquid delivering pump (15), an external heat fan (16), an upper room semiconductor refrigerating and heating unit (20), and a lower room semiconductor refrigerating and heating unit (21).

In one embodiment, the box body comprising two independent rooms, the independent rooms comprising the upper room 1 and the lower room 2, the bottom machine room 3 being located in the bottom of the box body. The upper room semiconductor refrigerating and heating unit 20 and a lower room semiconductor refrigerating and heating unit 21 constitute a refrigerating and heating unit. The upper room semiconductor refrigerating and heating unit 20 is located in the upper working room 4, the upper room semiconductor refrigerating and heating unit 20 comprises the external heat exchanger of the upper room 8, the first semiconductor chilling plate 7, and the internal heat exchanger of the upper room 6, and connects densely in sequence. The lower room semiconductor refrigerating and heating unit 21 is located in the lower working room 5, the lower room semiconductor refrigerating and heating unit 21 comprises the external heat exchanger of the lower room 11, the second semiconductor chilling plate 10, and the internal heat exchanger of the lower room 9, and connects densely in sequence. The external heat fan 16 is located in the bottom machine room 3, to improve heat exchange capacity.

In one embodiment, the upper room semiconductor refrigerating and heating unit 20 refrigerates or heats to the upper room 1 separately, the lower room semiconductor refrigerating and heating unit 21 refrigerates or heats to the lower room 2 separately. When the upper room semiconductor refrigerating and heating unit 20 heats to the upper room 1, and the lower room semiconductor refrigerating and heating unit 21 refrigerates to the lower room 2, to achieve heating and refrigerating to the upper room 1 and the lower room 2 respectively.

In one embodiment, the first composite condenser 13 comprises at least one single layer vertical condenser, the second composite condenser 14 comprises at least one single layer vertical condenser. The liquid delivering pump 15 is in one end of the bottom machine room 3, the external heat fan 16 is in the other end of the bottom machine room 3, the first composite condenser 13 is nearer to the external heat fan 16 than to the liquid delivering pump 15.

Figure 3:
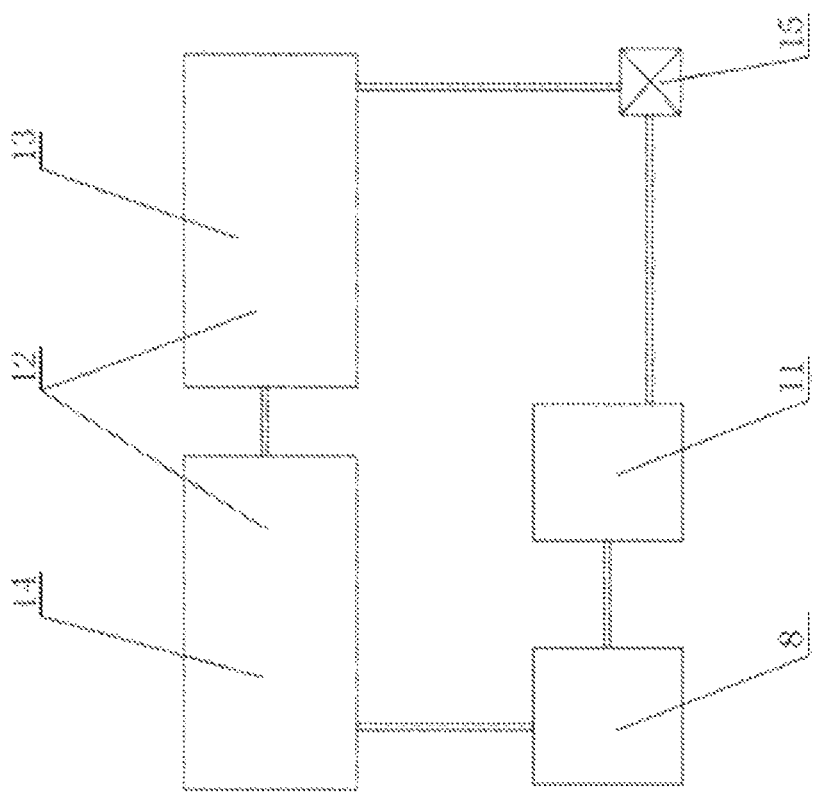
FIG. 3 is a structure diagram of one embodiment of a composite condenser unit, an external heat exchanger of an upper room, an external heat exchanger of a lower room, and a liquid delivering pump of the multi-functional semiconductor refrigerating and warming dual-purpose box of FIG. 1 as disclosed.

FIG. 3 is a structure diagram of one embodiment of the composite condenser unit 12, the external heat exchanger of the upper room 8, the external heat exchanger of the lower room 11, and the liquid delivering pump 15 of the multi-functional semiconductor refrigerating and warming dual-purpose box 100 of FIG. 1 as disclosed. The composite condenser unit 12 and the liquid delivering pump 15 are connected to the external heat exchanger of the upper room 8 and the external heat exchanger of the lower room 11 through pipes, to constitute circular flow paths of liquid. The composite condenser unit 12 comprises the first composite condenser 13 and the second composite condenser 14, the first composite condenser 13 and the liquid delivering pump 15 are located in the bottom machine room 3, the second composite condenser 14 is on the back of the box body.

Figure 4:
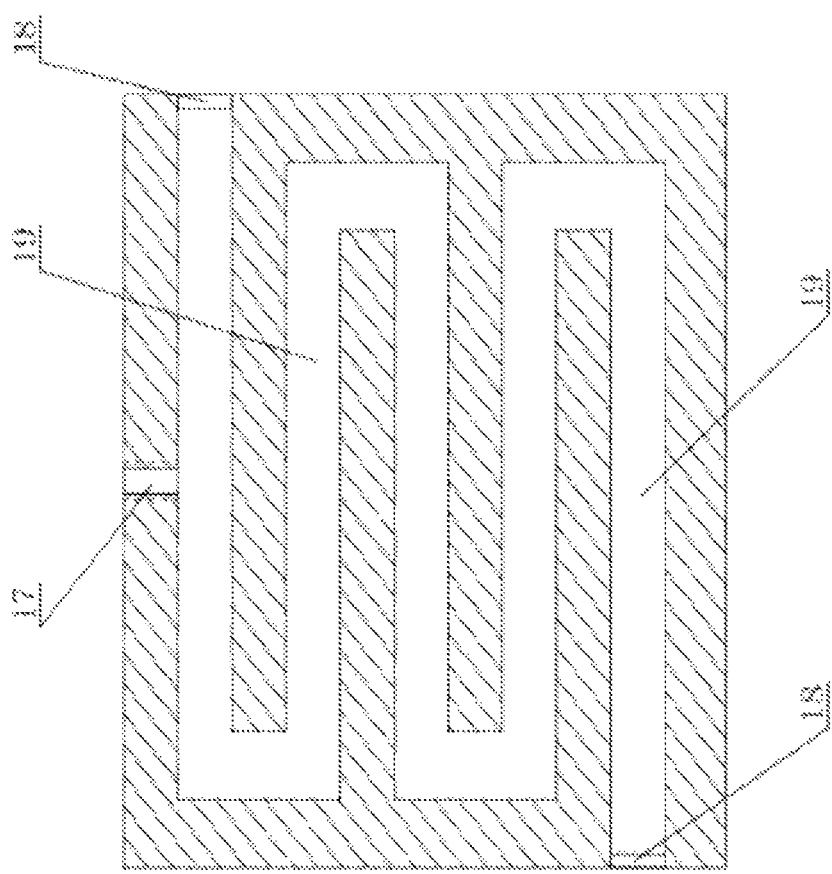
FIG. 4 is a section view of one embodiment of the external heat exchanger of the upper room of FIG. 1.

FIG. 4 is a section view of one embodiment of the external heat exchanger of the upper room 8 of FIG. 1. The external heat exchanger of the upper room 8 comprises inflow/outflow ports of the upper room 18, a first flow path 19, and a rehydration vent 17. The shape of the first flow path 19 is S, the inflow/outflow ports of the upper room 18 are in two ends of the first flow path 19, the rehydration vent 17 is located in the top of the external heat exchanger of the upper room 8.

Figure 5:
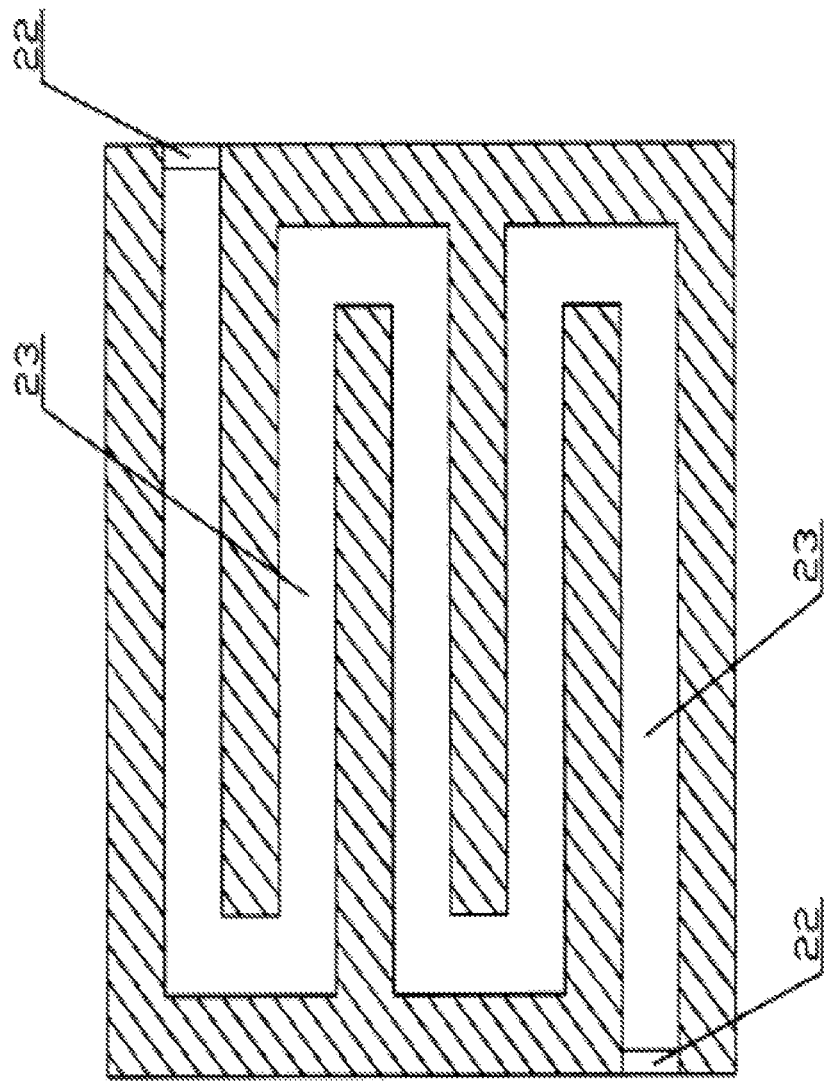
FIG. 5 is a section view of one embodiment of the external heat exchanger of the lower room of FIG. 1.

FIG. 5 is a section view of one embodiment of the external heat exchanger of the lower room 11 of FIG. 1. The external heat exchanger of the lower room 11 comprises inflow/outflow ports of the lower room 22 and a second flow path 23, the shape of the second flow path 23 is S, the inflow/outflow ports of the lower room 22 are in two ends of the second flow path 23. The upper working room 4 and the lower working room 5 are on the back of the box body.

A manufacturing method of the multi-functional semiconductor refrigerating and warming dual-purpose box 100 comprises: preparing a box body; preparing the refrigerating and heating unit; locating an external heat fan 16 in the bottom machine room 3, to improve heat exchange capacity; connecting the composite condenser unit 12 and the liquid delivering pump 15 to the external heat exchanger of the upper room 8 and the external heat exchanger of the lower room 9 through pipes, to constitute circular flow paths of liquid. The box body comprising two independent rooms, the bottom machine room 3, the upper working room 4, and the lower working room 5, the independent rooms comprises the upper room 1 and the lower room 2, the bottom machine room 3 is located in the bottom of the box body.

The refrigerating and heating unit comprises the upper room semiconductor refrigerating and heating unit 20 and the lower room semiconductor refrigerating and heating unit 21, the upper room semiconductor refrigerating and heating unit 20 is located in the upper working room 4, the upper room semiconductor refrigerating and heating unit 20 comprising the external heat exchanger of the upper room 8, the first semiconductor chilling plate 7, and the internal heat exchanger of the upper room 6, and connects densely in sequence. The lower room semiconductor refrigerating and heating unit 21 is located in the lower working room 5, the lower room semiconductor refrigerating and heating unit 21 comprises the external heat exchanger of the lower room 11, the second semiconductor chilling plate 10, and the internal heat exchanger of the lower room 9, and connects densely in sequence.

The composite condenser unit 12 comprises the first composite condenser 13 and the second composite condenser 14, the first composite condenser 13 and the liquid delivering pump 15 are located in the bottom machine room, the second composite condenser 14 is on the back of the box body.

The upper room semiconductor refrigerating and heating unit 20 refrigerates or heats to the upper room 1 separately, the lower room semiconductor refrigerating and heating unit 21 refrigerates or heats to the lower room 2 separately. The first composite condenser 13 comprises at least one single layer vertical condenser, the second composite condenser 14 comprises at least one single layer vertical condenser. The liquid delivering pump 15 is in one end of the bottom machine room 3, the external heat fan 16 is in the other end of the bottom machine room 3, the first composite condenser 13 is nearer to the external heat fan 16 than to the liquid delivering pump 15. The external heat exchanger of the upper room 8 comprises the inflow/outflow ports of the upper room 18, the first flow path 19, and the rehydration vent 17. The shape of the first flow 19 path is S, the inflow/outflow ports of the upper room 18 are in two ends of the first flow path 19, the rehydration vent 17 is located in the top of the external heat exchanger of the upper room 11. The external heat exchanger of the lower room 11 comprises the inflow/outflow ports of the lower room 22 and the second flow path 23, the shape of the second flow path 23 is S, the inflow/outflow ports of the lower room 22 are in two ends of the second flow path 23. The upper working room 4 and the lower working room 5 are on the back of the box body.

The refrigerating efficiency of the multi-functional semiconductor refrigerating and warming dual-purpose box 100 is large than the prior semiconductor box, almost three times. The volume of the multi-functional semiconductor refrigerating and warming dual-purpose box 100 is 500 L. The refrigeration depth of the multi-functional semiconductor refrigerating and warming dual-purpose box 100 is improved.

The foregoing disclosure of the various embodiments has been presented for purposes of illustration and description. It is not intended to be exhaustive or to limit the invention to the precise forms disclosed.

Many variations and modifications of the embodiments described herein will be apparent to one of ordinary skill in the art in the light of the above disclosure. The scope of the invention is to be defined only by the claims appended hereto and their equivalents.

What is claimed is:

1. A multi-functional semiconductor refrigerating and warming dual-purpose box, comprising:
    a box body comprising two independent rooms, a bottom machine room, an upper working room, and a lower working room, the independent rooms comprising an upper room and a lower room, the bottom machine room being located in the bottom of the box body;
    a refrigerating and heating unit comprising an upper room semiconductor refrigerating and heating unit and a lower room semiconductor refrigerating and heating unit, the upper room semiconductor refrigerating and heating unit being located in the upper working room, the upper room semiconductor refrigerating and heating unit comprising an external heat exchanger of the upper room, a first semiconductor chilling plate, and an internal heat exchanger of the upper room, and connecting densely in sequence, the lower room semiconductor refrigerating and heating unit being located in the lower working room, the lower room semiconductor refrigerating and heating unit comprising an external heat exchanger of the lower room, a second semiconductor chilling plate, and an internal heat exchanger of the lower room, and connecting densely in sequence; and
    a composite condenser unit and a liquid delivering pump connected to the external heat exchanger of the upper room and the external heat exchanger of the lower room through pipes, to constitute circular flow paths of liquid;
    wherein the composite condenser unit comprises a first composite condenser and a second composite condenser, the first composite condenser and the liquid delivering pump are located in the bottom machine room, the second composite condenser is on the back of the box body.

2. The multi-functional semiconductor refrigerating and warming dual-purpose box of claim 1, wherein the upper room semiconductor refrigerating and heating unit refrigerates or heats to the upper room separately, the lower room semiconductor refrigerating and heating unit refrigerates or heats to the lower room separately.

3. The multi-functional semiconductor refrigerating and warming dual-purpose box of claim 1, wherein the first composite condenser comprises at least one single layer vertical condenser, the second composite condenser comprises at least one single layer vertical condenser.

4. The multi-functional semiconductor refrigerating and warming dual-purpose box of claim 1, further comprising:
    an external heat fan located in the bottom machine room, to improve heat exchange capacity.

5. The multi-functional semiconductor refrigerating and warming dual-purpose box of claim 4, wherein the liquid delivering pump is in one end of the bottom machine room, the external heat fan is in the other end of the bottom machine room, the first composite condenser is nearer to the external heat fan than to the liquid delivering pump.

6. The multi-functional semiconductor refrigerating and warming dual-purpose box of claim 1, wherein the external heat exchanger of the upper room comprises inflow/outflow ports of the upper room, a first flow path, and a rehydration vent.

7. The multi-functional semiconductor refrigerating and warming dual-purpose box of claim 6, wherein the shape of the first flow path is S, the inflow/outflow ports of the upper room are in two ends of the first flow path, the rehydration vent is located in the top of the external heat exchanger of the upper room.

8. The multi-functional semiconductor refrigerating and warming dual-purpose box of claim 1, wherein the external heat exchanger of the lower room comprises inflow/outflow ports of the lower room and a second flow path, the shape of the second flow path is S, the inflow/outflow ports of the lower room are in two ends of the second flow path.

9. The multi-functional semiconductor refrigerating and warming dual-purpose box of claim 1, wherein the upper working room and the lower working room are on the back of the box body.

10. A manufacturing method of a multi-functional semiconductor refrigerating and warming dual-purpose box, comprising:
    preparing a box body, the box body comprising two independent rooms, a bottom machine room, an upper working room, and a lower working room, the independent rooms comprising an upper room and a lower room, the bottom machine room being located in the bottom of the box body;
    preparing a refrigerating and heating unit, the refrigerating and heating unit comprising an upper room semiconductor refrigerating and heating unit and a lower room semiconductor refrigerating and heating unit, the upper room semiconductor refrigerating and heating unit being located in the upper working room, the upper room semiconductor refrigerating and heating unit comprising an external heat exchanger of the upper room, a first semiconductor chilling plate, and an internal heat exchanger of the upper room, and connecting densely in sequence, the lower room semiconductor refrigerating and heating unit being located in the lower working room, the lower room semiconductor refrigerating and heating unit comprising an external heat exchanger of the lower room, a second semiconductor chilling plate, and an internal heat exchanger of the lower room, and connecting densely in sequence; and
    connecting a composite condenser unit and a liquid delivering pump to the external heat exchanger of the upper room and the external heat exchanger of the lower room through pipes, to constitute circular flow paths of liquid;
    wherein the composite condenser unit comprises a first composite condenser and a second composite condenser, the first composite condenser and the liquid delivering pump are located in the bottom machine room, the second composite condenser is on the back of the box body.

11. The manufacturing method of the multi-functional semiconductor refrigerating and warming dual-purpose box of claim 10, wherein the upper room semiconductor refrigerating and heating unit refrigerates or heats to the upper room separately, the lower room semiconductor refrigerating and heating unit refrigerates or heats to the lower room separately.

12. The manufacturing method of the multi-functional semiconductor refrigerating and warming dual-purpose box of claim 10, wherein the first composite condenser comprises at least one single layer vertical condenser, the second composite condenser comprises at least one single layer vertical condenser.

13. The manufacturing method of the multi-functional semiconductor refrigerating and warming dual-purpose box of claim 10, further comprising:
    locating an external heat fan in the bottom machine room, to improve heat exchange capacity.

14. The manufacturing method of the multi-functional semiconductor refrigerating and warming dual-purpose box of claim 13, wherein the liquid delivering pump is in one end of the bottom machine room, the external heat fan is in the other end of the bottom machine room, the first composite condenser is nearer to the external heat fan than to the liquid delivering pump.

15. The manufacturing method of the multi-functional semiconductor refrigerating and warming dual-purpose box of claim 10, wherein the external heat exchanger of the upper room comprises inflow/outflow ports of the upper room, a first flow path, and a rehydration vent.

16. The manufacturing method of the multi-functional semiconductor refrigerating and warming dual-purpose box of claim 15, wherein the shape of the first flow path is S, the inflow/outflow ports of the upper room are in two ends of the first flow path, the rehydration vent is located in the top of the external heat exchanger of the upper room.

17. The manufacturing method of the multi-functional semiconductor refrigerating and warming dual-purpose box of claim 10, wherein the external heat exchanger of the lower room comprises inflow/outflow ports of the lower room and a second flow path, the shape of the second flow path is S, the inflow/outflow ports of the lower room are in two ends of the second flow path.

18. The manufacturing method of the multi-functional semiconductor refrigerating and warming dual-purpose box of claim 10, wherein the upper working room and the lower working room are on the back of the box body.

* * * * *